US009304163B2

(12) United States Patent
Bhogela et al.

(10) Patent No.: US 9,304,163 B2
(45) Date of Patent: Apr. 5, 2016

(54) METHODOLOGY FOR TESTING INTEGRATED CIRCUITS

(71) Applicant: QUALCOMM Incorporated, San Diego, CA (US)

(72) Inventors: Sagar Bhogela, Bangalore (IN); Daisy Cynthia, Bangalore (IN); Srikanth Srinivasan, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 264 days.

(21) Appl. No.: 14/074,672

(22) Filed: Nov. 7, 2013

(65) Prior Publication Data

US 2015/0123696 A1    May 7, 2015

(51) Int. Cl.
*G01R 31/26* (2014.01)
*G01R 31/28* (2006.01)
*G01R 31/3185* (2006.01)

(52) U.S. Cl.
CPC ........ *G01R 31/2896* (2013.01); *G01R 31/2894* (2013.01); *G01R 31/318513* (2013.01); *G01R 31/318558* (2013.01)

(58) Field of Classification Search
CPC ........... G01R 31/2896; G01R 31/2894; G01R 31/318513; G01R 31/318558; G01R 31/318561; G01R 31/318563
USPC .............................. 324/762.01–762.06, 73.1, 324/750.01–750.02, 750.3, 757.04–757.05; 714/724–731, 733
See application file for complete search history.

(56) References Cited

U.S. PATENT DOCUMENTS

| | | | | |
|---|---|---|---|---|
| 6,734,693 B2 * | 5/2004 | Nakayama | ..... | G01R 31/318558 324/750.15 |
| 6,825,683 B1 * | 11/2004 | Berndt | ........... | G01R 31/318513 324/750.3 |
| 7,161,175 B2 | 1/2007 | Shau | | |
| 7,313,740 B2 * | 12/2007 | Ong | ................. | G01R 31/31813 714/718 |
| 7,345,935 B2 | 3/2008 | Matsumoto | | |
| 7,375,541 B1 * | 5/2008 | Chen | ................ | G01R 31/31719 324/750.3 |
| 7,412,639 B2 | 8/2008 | Volkerink | | |
| 8,289,041 B2 * | 10/2012 | Yamane | ............. | G11C 29/1201 324/750.3 |
| 8,400,181 B2 | 3/2013 | Bhaskarani | | |
| 2003/0126533 A1 * | 7/2003 | McAdams | ..... | G01R 31/318536 714/727 |

(Continued)

OTHER PUBLICATIONS

International Search Report and Written Opinion—PCT/US2014/062538—ISA/EPO—Feb. 9, 2015.

(Continued)

*Primary Examiner* — Arleen M Vazquez
*Assistant Examiner* — Lee Rodak
(74) *Attorney, Agent, or Firm* — Arent Fox LLP

(57) ABSTRACT

An integrated circuit is disclosed. The integrated circuit includes input and output pads, a first integrated circuit portion having first circuitry, and a second integrated circuit portion having second circuitry different from the first circuitry. The first integrated circuit portion is configured to provide an input test signal from the input pad to the second integrated circuit portion, and provide an output test signal from the second integrated circuit portion to the output pad, the output test signal being generated by second integrated circuit portion in response to the input test signal.

27 Claims, 6 Drawing Sheets

(56) References Cited

U.S. PATENT DOCUMENTS

| | | | |
|---|---|---|---|
| 2005/0193302 A1* | 9/2005 | Arguelles | G01R 31/31716 714/733 |
| 2006/0279308 A1* | 12/2006 | Ong | G01R 31/31701 324/750.3 |
| 2011/0316572 A1 | 12/2011 | Rahman | |
| 2012/0138927 A1 | 6/2012 | Kang | |
| 2013/0035090 A1* | 2/2013 | Moshfeghi | H04W 88/04 455/422.1 |
| 2013/0099235 A1 | 4/2013 | Han | |
| 2013/0185608 A1 | 7/2013 | Bhawmik | |

OTHER PUBLICATIONS

Marinissen E. J., et al., "A DfT Architecture for 3D-SICs Based on a Standardizable Die Wrapper", Journal of Electronic Testing; Theory and Applications, Kluwer Academic Publishers, BO, vol. 28, No. 1, Dec. 13, 2011, pp. 73-92, XP035018615, ISSN: 1573-0727, DOI: 10.1007/S10836-011-5269-9.

* cited by examiner

METHODOLOGY FOR TESTING INTEGRATED CIRCUITS

BACKGROUND

Field

The present disclosure relates generally to integrated circuits, and more particularly, to methodologies for testing integrated circuits.

INTRODUCTION

An integrated circuit includes one or more dies encapsulated in a plastic or ceramic package. A die is an electronic circuit formed on a semiconductor material. Typically, dies are produced in large batches on a single wafer of silicon or other semiconductor material through processes well known in the art. The wafer may then be cut up or separated into individual dies. The dies are later packaged into protective cases to prevent physical and environmental damage. The case, which is commonly referred to as a "package," supports electrical pads that connect remote devices to the integrated circuit.

Dies can be either digital or analog. In many telecommunication devices, such as mobile phones, personal digital assistants (PDAs), desktop computers, laptop computers, palm-sized computers, tablet computers, work stations, game consoles, media players, and the like, the digital and analog dies are packaged in separate integrated circuits. These integrated circuits are monolithic in that each package contains just one die. By way of example, a typical telecommunications device may have a baseband processor by one integrated circuit and the wireless modem provided by another integrated circuit.

In order to meet the increasing demand for smaller and lower cost devices, the semiconductor industry is moving towards technology that combines more functionality into a single package. This technology is often implemented with integrated circuits that are hybrids meaning that multiple dies are combined into a single package. This presents certain technical challenges when attempting to combine digital and analog dies into a single package for telecommunication applications. These analog dies have very few digital pads to communicate with the digital dies and these pads are die-to-die pads which are not accessible to the testing personnel.

Accordingly, there is a need in the art for testing hybrid integrated circuits having both digital and analog dies.

SUMMARY

Aspects of an integrated circuit are disclosed. The integrated circuit includes input and output pads, a first integrated circuit portion having first circuitry, and a second integrated circuit portion having second circuitry different from the first circuitry. The first integrated circuit portion is configured to provide an input test signal from the input pad to the second integrated circuit portion, and provide an output test signal from the second integrated circuit portion to the output pad, the output test signal being generated by second integrated circuit portion in response to the input test signal.

Aspects of a method of testing an integrated circuit are disclosed. The integrated circuit includes input and output pads, a first integrated circuit portion having first circuitry, and a second integrated circuit portion having second circuitry different from the first circuitry. The method includes providing an input test signal from the input pad through the first integrated circuit portion to the second integrated circuit portion, generating an output test signal in response to the input test signal at the second integrated circuit portion, and providing the output test signal from the second integrated circuit portion through the first integrated circuit portion to the output pad.

Further aspects of an integrated circuit are disclosed. The integrated circuit includes input and output pads, a first integrated circuit portion having first circuitry, and a second integrated circuit portion having second circuitry different from the first circuitry. The first integrated circuit portion includes means for providing an input test signal from the input pad to the second integrated circuit portion, and means for providing an output test signal from the second integrated circuit portion to the output pad, the output test signal being generated by the second integrated circuit portion in response to the input test signal.

It is understood that other aspects of apparatus and methods will become readily apparent to those skilled in the art from the following detailed description, wherein various aspects of apparatuses, methods and articles of manufacture are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

Figure 1:
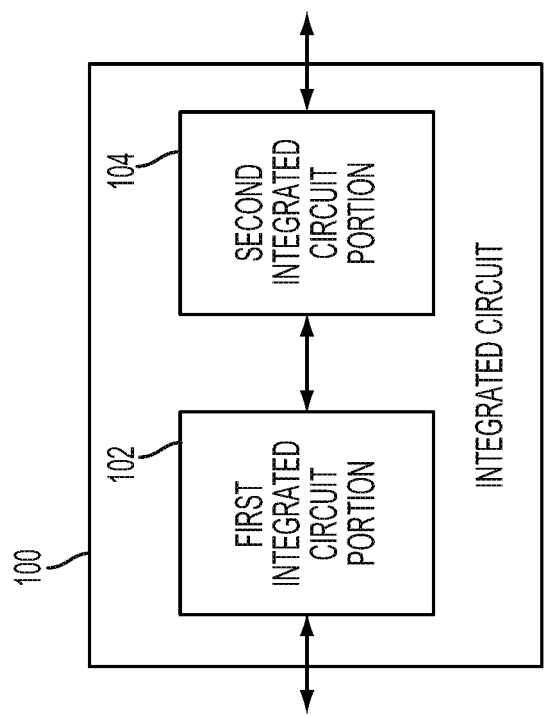
FIG. 1 is a block diagram illustrating an example of an integrated circuit.

In accordance with common practice, some of the drawings may be simplified for clarity. Thus, well-known structures and components may be shown in block diagram form, or omitted entirely, in order to avoid obscuring the various concepts presented throughout this disclosure.

DETAILED DESCRIPTION

Various aspects of the apparatuses and methods will be described more fully hereinafter with reference to the accompanying drawings. These apparatuses and methods may, however, be embodied in many different forms by those skilled in the art and should not be construed as limited to any specific apparatus or method presented herein. Rather, these aspects are provided so that this disclosure will be thorough and complete, and will fully convey the scope of the invention to those skilled in the art. Based on the teachings herein, one skilled in the art should appreciate that the scope of the invention is intended to cover any aspect presented in this disclosure, whether implemented independently of or combined with any other aspect presented in this disclosure. For example, an apparatus may be implemented or a method may be practiced using any number of aspects set forth herein. In addition, an apparatus or method may be implemented using other structure and/or functionality in addition to or instead of other aspects presented in this disclosure. Accordingly, the claims should not be limited to the various aspects of the apparatuses and methods presented throughout this disclosure, but should be accorded the full scope consistent with the language of claims.

The term "apparatus" shall be construed broadly to mean any integrated circuit, or any portion of an integrated circuit (e.g., blocks, modules, components, circuits, elements, or the like), or any intermediate product where an integrated circuit is combined with other integrated circuits or components (e.g., a video card, motherboard, etc.) or any end product (e.g., mobile phone, personal digital assistant (PDA), desktop computer, laptop computer, palm-sized computer, tablet computer, work station, game console, media player, or the like). The term "method" shall similarly be construed broadly to mean the operation of an integrated circuit, or any portion thereof, or any intermediate or end product, or any step, process, algorithm, or the like, or any combination thereof performed by such integrated circuit (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

The term "signal" can include any signal such as a data signal, audio signal, video signal, multimedia signal. Information and signals can be represented using any of a variety of different technologies and techniques. By way of example, data, instructions, commands, information, signals, bits, symbols, and chips that can be referenced throughout this description can be represented by voltages, currents, electromagnetic waves, magnetic fields or particles, optical fields or particles, or any combination thereof.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. Also, unless stated otherwise a set of elements can comprise one or more elements. In addition, terminology of the form "at least one of: A, B, or C" used in the description or the claims means "A or B or C or any combination of these elements."

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of the stated features, integers, steps, operations, elements, and/or components, but do not preclude the presence or addition of one or more other features, integers, steps, operations, elements, components, and/or groups thereof.

Various aspects relating to scan and functional testing of integrated circuits will now be presented. However, as those skilled in the art will readily appreciate, such aspects may be extended to other testing procedures for integrated circuits and other apparatuses. According any reference to a specific testing procedure is intended only to illustrate exemplary aspects for testing an integrated circuit or apparatus with the understanding that such aspects have a wide range of applications.

The term "pass-through" or "pass-through circuit" or any term or phrase used to describe a signal that is passed through a circuit, block, module, element, integrated circuit portion, or the like shall not be limited to a direct connection. Such terms or phrases shall also include indirect connections with one or more intermediate elements. By way of example, a pass-through circuit may include any number of buffers, inverters, delays, amplifiers, attenuators, and the like in the signal path. A pass-through circuit shall encompass all circuits that pass a signal without the possibility of being multiplexed or switched with another signal.

FIG. 1 is a block diagram illustrating an example of an integrated circuit. The integrated circuit 100 may be configured to operate as part of any suitable apparatus. In one embodiment, the integrated circuit 100 may be configured to operate as part of a telecommunications device, such as a mobile phone, personal digital assistant (PDA), desktop computer, laptop computer, palm-sized computer, tablet computer, set-top box, navigation device, work station, game console, media player, or any other suitable device. The integrated circuit 100 may be configured to support communications over a wired or wireless channel. In the case of a wireless the channel, the integrated circuit 100 may be configured to support any suitable multiple access technology, including by way of example, Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access technologies. The integrated circuit 100 may be further configured to support any suitable air interface standard, including by way of example, Long Term Evolution (LTE), Evolution-Data Optimized (EV-DO), Ultra Mobile Broadband (UMB), Universal Terrestrial Radio Access (UTRA), Global System for Mobile Communications (GSM), Evolved UTRA (E-UTRA), IEEE 802.11 (Wi-Fi), IEEE 802.16 (WiMAX), IEEE 802.20, Flash-OFDM, Blueooth, or any other suitable air interface standard. The actual air interface standard and the multiple access technology supported by the integrated circuit 100 will depend on the specific application and the overall design constraints imposed on the system.

The integrated circuit 100 is shown with a first integrated circuit portion 102 and a second integrated circuit portion 104, but may have additional integrated circuit portions. In an exemplary embodiment, the first integrated circuit portion 102 may be a baseband processor and the second integrated circuit portion 104 may be a wireless modem. The wireless modem may provide a transceiver function for modulating one or more carrier signals with a data generated by the baseband processor for transmission over a wireless channel and demodulating one or more carrier signals received over the wireless channel from a remote apparatus to recover data for further processing by the baseband processor.

Figure 2:
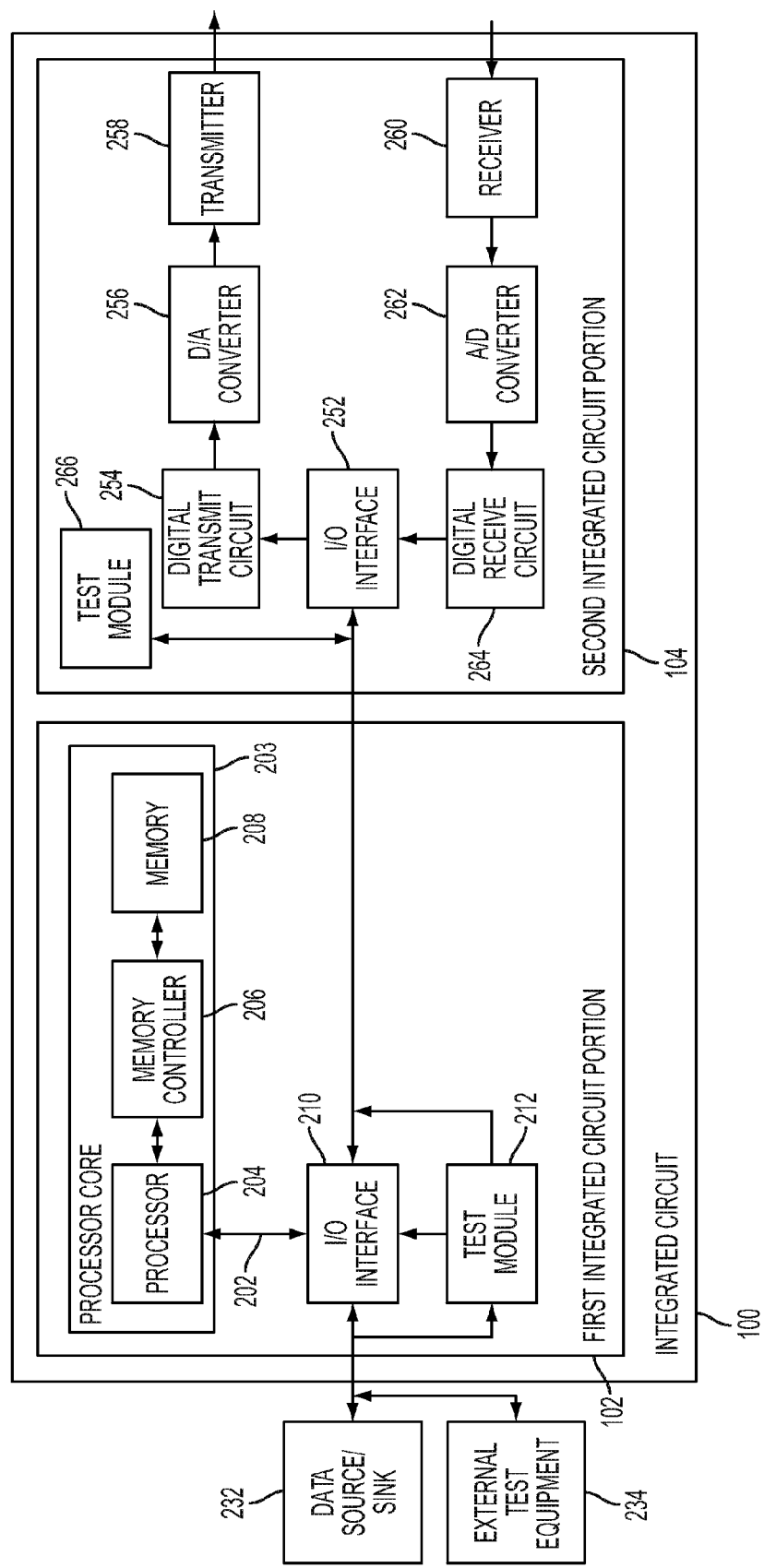
FIG. 2 is a block diagram illustrating an example of first and second integrated circuit portions of an integrated circuit.

FIG. 2 is a block diagram illustrating an example of first and second integrated circuit portions of an integrated circuit. The first integrated circuit portion 102 is a baseband processor which is implemented with a bus architecture. The bus architecture may support any number of interconnecting buses and bridges depending on the specific application and the overall design constraints. The bus 202 is used to link together various circuits in the core processor 203 including a processor 204, a memory controller 206, memory 208, and various other circuits not shown such as timing sources, voltage regulators, power management circuits, and the like. The bus 202 also links the core processor 203 to various I/O interfaces, represented generally by I/O interface 210, a test module 212, and other supporting circuits not shown.

The processor 204 is responsible for managing the bus and general processing, including the execution of software stored in memory 208 or retrieved from off-chip memory through the I/O interface 210. The processor 204 may be implemented with one or more general-purpose and/or special-purpose processors. Examples include microprocessors, microcontrollers, DSP processors, and other circuitry that can execute software programs. Software shall be construed broadly to mean any instructions, whether referred to as software, firmware, middleware, microcode, hardware description language, or otherwise. Memory 208 may include, by way of example, RAM (Random Access Memory), SRAM (Static Random Access Memory), DRAM (Dynamic Random Access Memory), SDRAM (Synchronous Dynamic Random Access Memory), flash memory, or any other suitable storage medium, or any combination thereof. The software includes instructions that when executed by the processor 204 cause the baseband processor to perform various functions. The software may be loaded into memory 208 from a hard drive or other non-volatile storage when a triggering event occurs. During execution of the software, the processor 204 may load some of the instructions into cache to increase access speed. One or more cache lines may then be loaded into a general register file for execution by the processor 204. Alternatively, or in addition to, the processor 204 may be implemented with dedicated hardware such as, by way of example, one or more FPGAs (Field Programmable Gate Array), PLDs (Programmable Logic Device), controllers, state machines, gated logic, discrete hardware components, or any other suitable circuitry, or any combination thereof.

The I/O interface 210 may be used to interface the baseband processor to a data source/sink 232. The data source/sink 232 may be a host computer, or other system, either in the apparatus or external to the apparatus. The I/O interface 210 may be configured to support a two-wire connection, an Ethernet connection, or some other suitable connection to the data source/sink 232. In some exemplary embodiments, the data source/sink 232 may include a user interface, such as a keypad, mouse, joystick, display, and/or the like.

The I/O interface 210 may also be used to interface the baseband processor to the second integrated portion 104. In this example, the second integrated portion 104 is a wireless modem which has its own I/O interface 252 to connect transmit and receive channels to the baseband processor. The transmit channel includes a digital transmit circuit 254 that provides various processing for the digital baseband signal before being converted to an analog signal by a digital-to-analog (D/A) converter 256. The analog signal from the D/A converter 256 is provided to a wireless transmitter 258 which provides various stages of mixing (i.e., up-conversion), filtering, and amplifying to modulate the analog signal onto one or more high frequency carriers for transmission over a wireless channel.

The receive channel includes a wireless receiver 260 configured to receive one or more high frequency modulated carriers from a remote apparatus over wireless channel. The wireless receiver 260 similarly provides various stages of mixing (i.e., down-conversion), filtering, and amplifying to demodulate the carriers and recover the analog signal transmitted by the remote apparatus. The analog signal recovered by the wireless receiver 260 is converted to a digital signal by an analog-to-digital (A/D) converter 262 and processed by a digital receive circuit 264 before being provided to the baseband processor.

Various test functions may be built into the integrated circuit 100. In a manner to be described in greater detail later, the test module 212 in the first integrated circuit portion 102 may be used to enable both scan and functional testing of the integrated circuit 100. These tests may be performed before and/or after the integrated circuit 100 is installed into the apparatus. For the purpose of this disclosure, "scan test" refers to an Automatic Test Pattern Generation (ATPG) process whereby a test pattern, when provided to the first integrated circuit portion 102, enables external test equipment 234 to detect defects introduced during the manufacturing process of the integrated circuit 100. "Functional test" refers to a process whereby a test pattern, when provided to the first integrated circuit portion 102, enables external test equipment 234 to determine whether hard macros (HM) on the integrated circuit are functioning properly. A HM is a functional unit (e.g., processor, graphics, etc.), memory, or the like.

The scan test may be performed using a test protocol and test mechanism known as Joint Test Action Group (JTAG), or some other suitable methodology. JTAG is standardized under the IEEE standard 1149.1. During the scan test, the test module 212 may signal the I/O interface in the first integrated circuit portion 102, as well as a similar test module 266 residing in the second integrated circuit portion 104. In response, the I/O interface 210 in the first integrated circuit portion 102 may disconnect the core processor 203 from the data source/sink 232, provide input test signals from the external test equipment 234 to the core processor 203, and read output test signals back from the core processor 203. The test module 266 in the second integrated circuit portion 104 may cause the I/O interface 252 to disconnect the digital transmit and receive circuits 254 and 260 from the core processor 203, receive input test signals received from the external test equipment 234 via the I/O interface 210 in first integrated circuit portion 102, provide those input test signals to the digital transmit and receive circuits 254 and 260, read output test signals back from the digital transmit and receive circuits 254 and 260, and forward the output test signals to the I/O interface 210. The output test signals from the core processor 203 and the output test signals from the digital transmit and receive circuits 254 and 260 may be provided to the external test equipment 234 by the I/O interface 210. The external test equipment 234 may provide an indication that the integrated circuit 100 is free of manufacturing defects if the output test signals match the expected outputs for the input test signals. On the other hand, the external test equipment 234 may provide an indication that the integrated circuit 100 is defective if the output test signals differ from what is expected for the input test signals. Preferably, the external test equipment is configured to provide a wide range of test patterns in order to cover an adequate range of input test signals to detect defects with a high degree of certainty.

Figure 3:
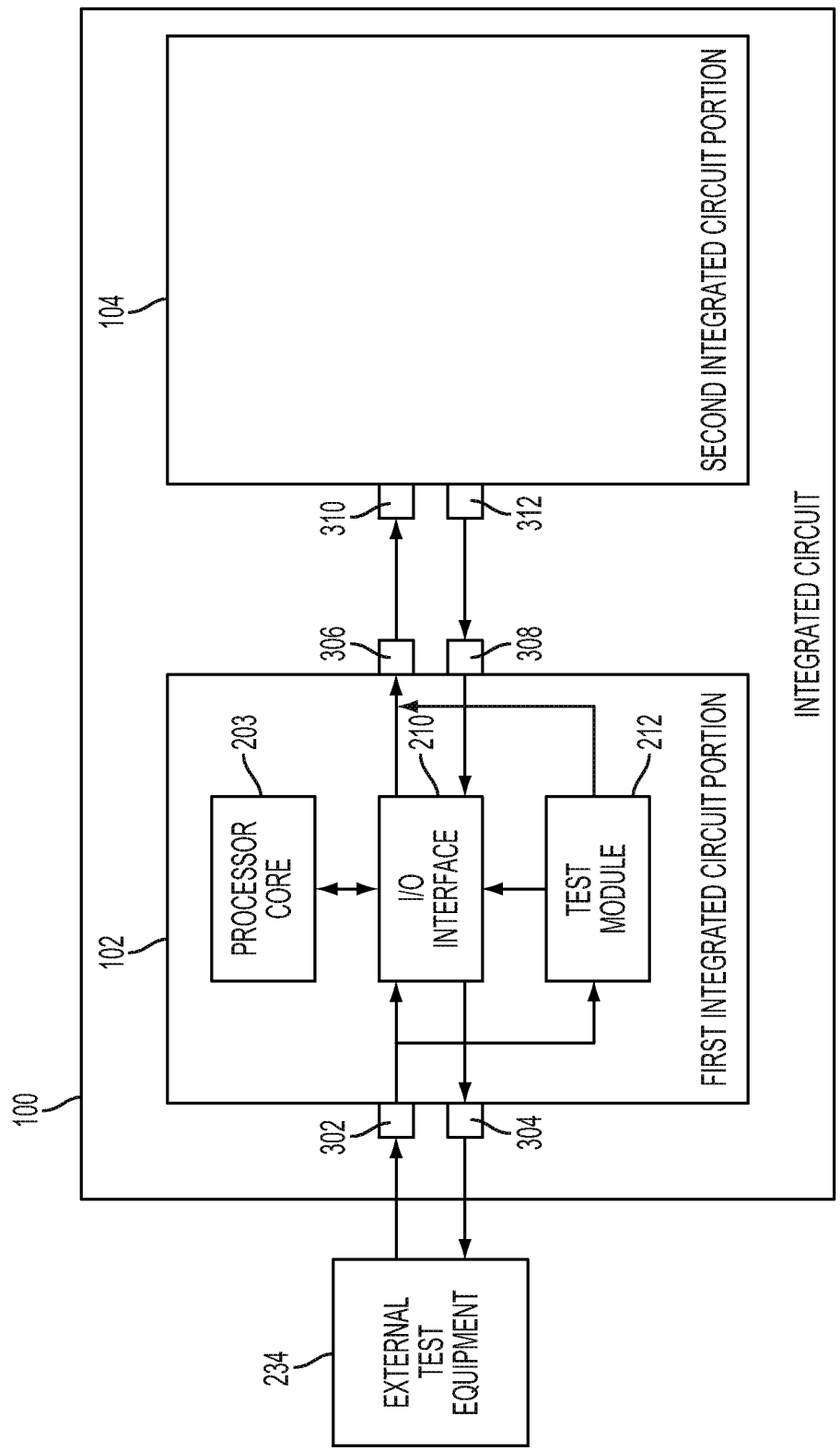
FIG. 3 is a block diagram illustrating an example of the first integrated circuit portion with scan test capability.

FIG. 3 is a block diagram illustrating an example of the first integrated circuit portion with scan test capability. In this example, the integrated circuit 100 includes a pair of accessible scan test pads for the second integrated circuit portion 102 comprising a scan test input pad 302 and a scan test output pad 304. The scan test pads 302 and 304 may be general-purpose I/O pads or other suitable test pads. The scan test pads 302 and 304 may be separate from scan test pads (not shown) for testing the first integrated circuit portion 102 or, in other embodiments, may be shared between the first and second integrated circuit portions 102 and 104 utilizing a switching, time sharing, or other mechanism. The scan test pads 302 and 304 allow external test equipment to be connected the first integrated circuit portion 102.

The first integrated circuit portion 102 also includes a pair of die-to-die (D2D) scan test pads comprising a D2D scan test output 306 and a D2D scan test input 308. These D2D scan test pads are not accessible external to the integrated circuit 100. Rather, they provide an internal connection with corresponding D2D scan test pads for the second integrated circuit portion 104. The D2D scan test pads for the second integrated circuit portion 104 include a D2D scan test input pad 310 and a D2D scan test output pad 312.

During the scan test mode, external test equipment 234 may be connected to scan test pads on the integrated circuit 100. The external test equipment 234 may provide a mode control signal along with input test signals to the scan test input pad 302. The mode control signal provides an indication to the test module 212 that the integrated circuit 100 is under test. In response to the mode control signal, the test module 212 signals both the I/O interface 210 in the first integrated circuit 102 and the test module 266 in the second integrated circuit portion 104. The I/O interface 212 includes a pass-through circuit which serves as a means for providing the input test signals from the scan test input pad 302 through the first integrated circuit portion 102 to the D2D scan test output pad 306. The input test signals may then be transmitted to the second integrated circuit portion 104 by the connection between the D2D scan test output pad 306 on the first integrated circuit portion 102 and the D2D scan test input pad 310 on the second integrated circuit portion 104.

The output test signals generated by the digital transmit and receive circuits 254 and 260 (see FIG. 2) may be provided to the first integrated circuit portion 102 by the connection between the D2D scan test output pad 312 on the second integrated circuit portion 104 and the D2D scan test input pad 308 on the first integrated circuit portion 102. In a manner similar to the input test signals, the I/O interface 210 includes a pass-through circuit which serves as a means for providing the output test signals from the D2D scan test input pad 308 through the first integrated circuit portion 102 to the scan test output pad 304. The output test signals may then be transmitted to the external test equipment 234 for processing through the scan test output pad 304.

Figure 4:
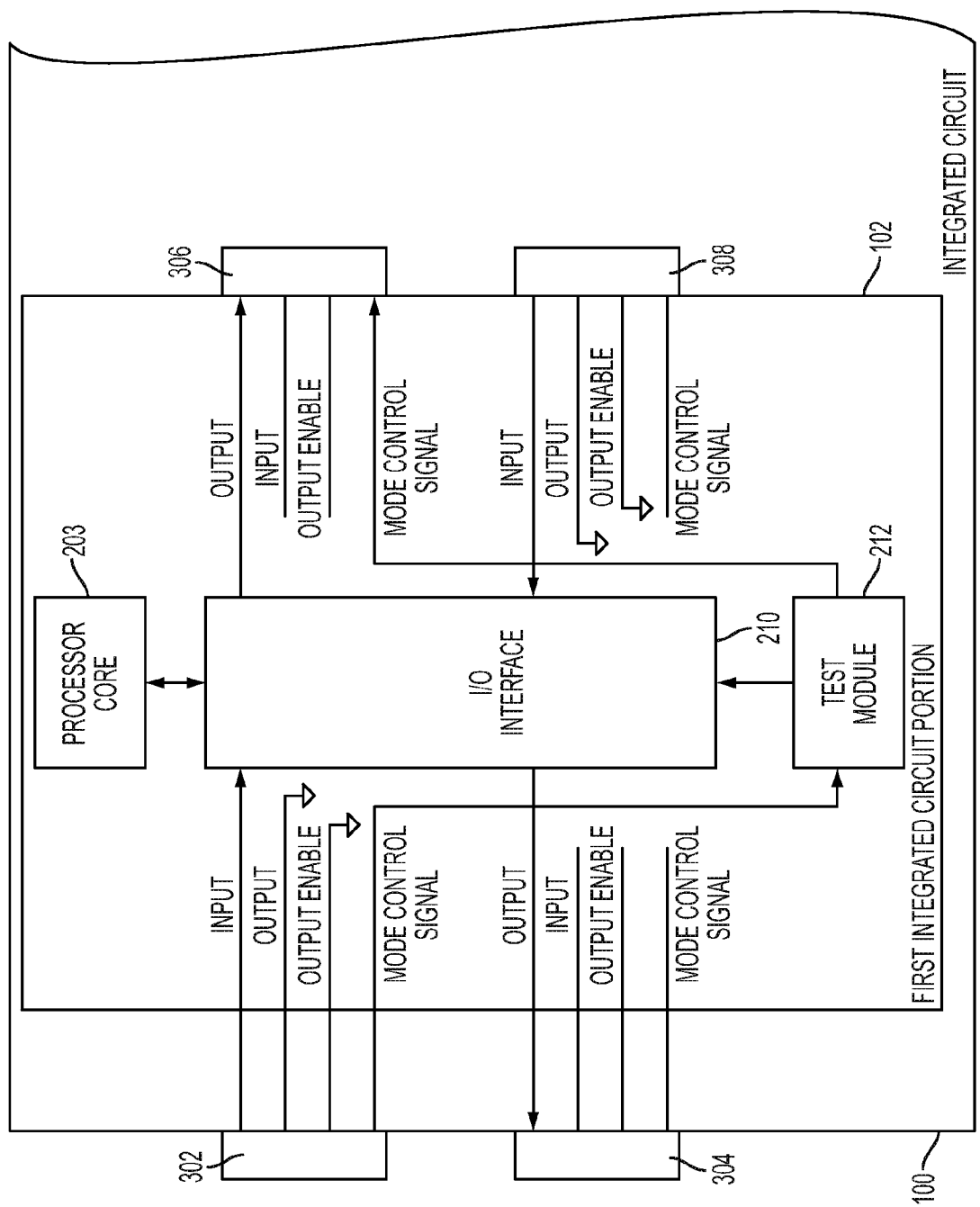
FIG. 4 is a schematic diagram illustrating an example of the scan test pad connection for first integrated circuit portion.

FIG. 4 is a schematic diagram illustrating an example of the scan test pad connection for first integrated circuit portion. As discussed earlier, the first integrated circuit portion 102 uses four scan test pads 302, 304, 306 and 308 to support scan testing for the second integrated circuit 104 (see FIG. 3). Each scan test pad supports four connections: an input, an output, and output enable, and a signal control mode. To support the implementation of the scan test mode discussed earlier in connection with FIG. 3, the scan test pads may be connected as follows.

The input connection for the scan test input pad 302 is coupled through the I/O interface 210 to the output connection of the D2D scan test output pad 306. As described earlier, the test signal inputs from the external text equipment are routed through the first integrated circuit portion to the second integrated circuit portion along this path. The scan test input pad 302 also has its signal control mode connection coupled to the input of the test module 212, which allows an external source to force the integrated circuit 100 into the scan test mode. An output from the test module 212 is coupled to the signal control mode connection of the D2D scan test output pad 306 to provide force the second integrated circuit portion 104 (see FIG. 3) into the scan test mode. Since the scan test input pad 302 is serving as an input for the test signals, the output and output enable connections may be grounded. Since the D2D scan test output pad 306 is serving as an output for the test signals, the output and output enable connections may be floating or pulled high. The polarities of the output and output enable connections for all connections may be reversed in other embodiments.

The input connection for the D2D scan test input pad 308 is coupled through the I/O interface 210 to the output connection of the scan test output pad 304. As described earlier, the test signal outputs from the digital transmit and receive circuits 254 and 260 (see FIG. 2) are routed through the first integrated circuit portion to the external test equipment along this path. The signal control mode connection for both the scan test input pad 308 and the scan test output pad 304 are not used, and therefore, may be left floating or pulled high. Since the D2D scan test input pad 308 is serving as an input for the output test signals, the output and output enable connections may be grounded. Since the scan test output pad 304 is serving as an output for the test signals, the output and output enable connections may be floating or pulled high. The polarities of the signal control mode, output and output enable connections may be reversed in other embodiments.

The functional test may be performed using any suitable test protocol and test mechanism. Returning to FIG. 2, in one exemplary embodiment, the external test equipment 234 may be connected to the data pads of the integrated circuit 102, the same data pads that would otherwise be connected to the data source/sink 232 during normal operation. With this configuration, the input test signals may be provided by the external test equipment 232 to the first integrated circuit portion 102 and processed by the processor core 203 to produce output test signals. The output test signals may then be transmitted back to the external test equipment 234 by the I/O interface 210 through the data pads on the integrated circuit 100.

Figure 5:
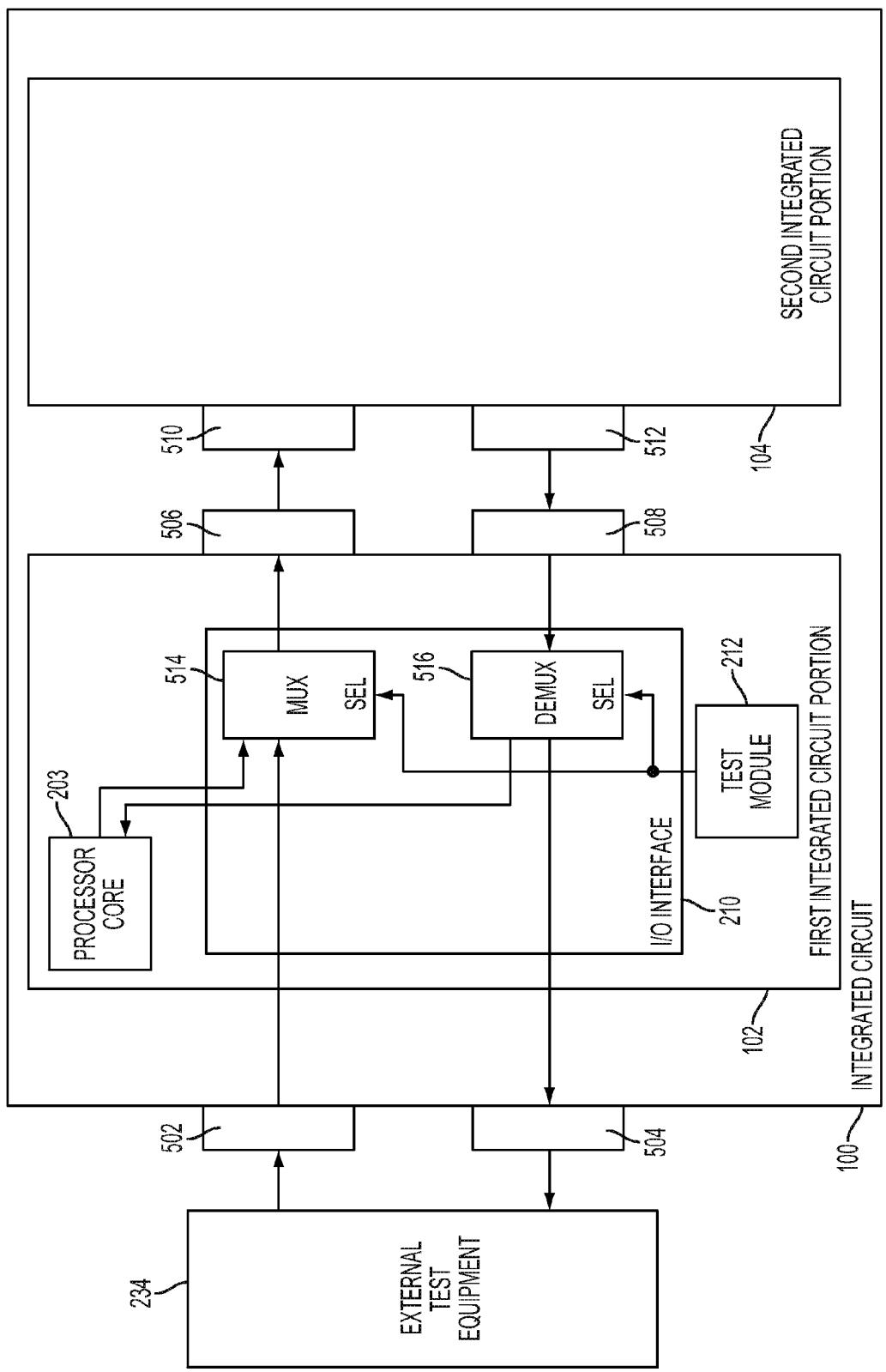
FIG. 5 is a block diagram illustrating an example of an integrated circuit with functional testing capability.

Separate functional test pads on the integrated circuit 100 may be provided to support functional testing for the second integrated circuit portion 104. FIG. 5 is a block diagram illustrating an example of an integrated circuit with functional testing capability. In this example, the integrated circuit 100 includes a pair of accessible functional test pads comprising a functional test input pad 502 and a functional test output pad 504. The functional test pads 502 and 504 may be general-purpose I/O pads or other suitable test pads. The functional test pads 502 and 504 allow external test equipment to be connected the first integrated circuit portion 102.

The first integrated circuit portion 102 also includes a pair of D2D data pads comprising a D2D data output 506 and a D2D data input. These D2D data pads are not accessible external to the integrated circuit 100. Rather, they provide an internal connection with corresponding D2D data pads for the second integrated circuit portion 104. The D2D data pads for the second integrated circuit portion 104 include a D2D data input pad 510 and a D2D data output pad 512. In a manner to be described in greater detail below, the I/O interface 210 may provide a switching function that provides for data exchange between the processing core 203 and the second integrated circuit portion 104 during normal operation and also provides for the exchange of test signals between external test equipment 234 and the second integrated circuit portion 104 during the functional test mode.

During the functional test mode, external test equipment 234 may be connected to functional test pads on the integrated circuit 100. The external test equipment 234 may provide a mode control signal and input test signals to the functional test input pad 502. The mode control signal along with the input test signals may be provided to a multiplexer 514 in the I/O interface 210. The multiplexer 514 serves as a means for providing the input test signals from the functional test input pad to the second integrated circuit portion 104. More specifically, the multiplexer 514 switches the output to the second integrated circuit portion 104 between data from the core processor 203 and input test signals from the external test equipment 234. The mode control signal may be used to drive the select input to the multiplexer 514. In an exemplary embodiment, the data generated by the processor core 203 may be provided to the second integrated circuit portion 104 when the mode control signal indicates normal operation and the input test signals generated by the external test equipment 234 may provided to the second integrated circuit portion 104 when the mode control signal indicates test.

The I/O interface 210 may also include a demultiplexer 516. The demultiplexer 516 serves as a means for providing the test signal outputs from the second integrated circuit portion 104 to the functional test output pad. More specifically, the demultiplexer 516 switches the input from the second integrated circuit portion 104 between the core processor 203 and the external test equipment 234. The mode control signal may be used to drive the select input to the demultiplexer 516. In an exemplary embodiment, the input from the second integrated circuit portion 104 may be provide to the processor core 203 when the mode control signal indicates normal operation and to the external test equipment 234 when the mode control signal indicates test.

Figure 6:
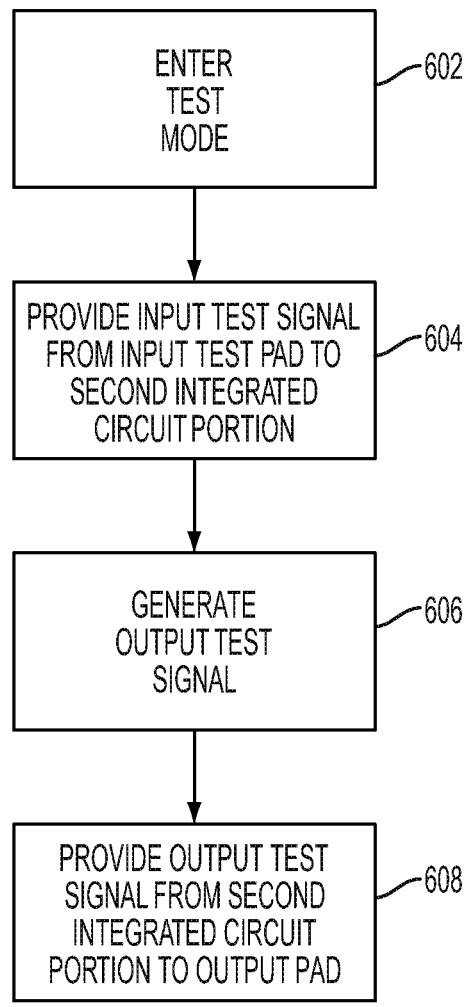
FIG. 6 is a flow diagram illustrating an example of a method for testing an integrated circuit.

FIG. 6 is a flow diagram illustrating an example of a method for testing an integrated circuit. As described in detail earlier in this disclosure, the integrated circuit may include input and outputs pads that may be connected to external test equipment. The test pads may be GPIO pads or other suitable test pads. The integrated circuit may also include a first integrated circuit portion having first circuitry, and a second integrated circuit portion having second circuitry different from the first circuitry. The first and second integrated circuit portions may be fabricated on different wafers and encapsulated into a single package.

Turing to FIG. 6, the first and second integrated circuit portions enter a test mode in block 602. The first integrated circuit portion causes the second integrated circuit portion to enter the test mode by providing one or more control signals to the second integrated circuit portion in response to one or more control signals received at the input pad. The test mode may be a scan test mode, a functional test mode, or some other suitable test mode.

In block 604, the first integrated circuit portion provides an input test signal received at the input pad to the second integrated circuit portion. As discussed earlier, the input test signal may be provided to the second integrated circuit portion by a pass-through circuit, multiplexer, or other suitable means in the first integrated circuit portion.

In block 606, the second integrated circuit portion generates an output test signal in response to the input test signal.

In block 608, the first integrated circuit portion provides the output test signal from the second integrated circuit portion to the output pad. As discussed earlier, the output test signal may be provided to the output pad by a pass-through circuit, demultiplexer, or other suitable means in the first integrated circuit portion.

It is understood that any specific order or hierarchy of blocks described in the context of testing an integrated circuit is being presented to provide an example of a method for testing an integrated circuit. Based upon design preferences, it is understood that the specific order or hierarchy of blocks may be rearranged while remaining within the scope of the invention.

Various aspects of testing an integrated circuit have been described above in connection with performing either a scan test or functional test. Certain aspects of the scan test have been described with an integrated circuit having a first integrated circuit portion with a pass-through circuit to provide test signals between the test pads and the second integrated circuit portion. Also, certain aspects of the functional test have been described in connection with an integrated circuit having a first integrated circuit portion with multiplexer and demultiplexer circuits to provide test signals between the test pads and the second integrated circuit portion. However, as those skilled in the art will readily appreciate, the various methodologies described for transferring test signals through the first integrated circuit portion is not necessarily limited to the exemplary embodiments described. By way of example, the pass-through circuit in the first integrated circuit portion described herein for scan testing may be used for functional testing, or other testing, in other embodiments of integrated circuits. Likewise, the multiplexing and demultiplexing circuits in the first integrated circuit portion described herein for functional testing may be used for scan testing, or other testing, in other embodiments of integrated circuits.

The previous description is provided to enable any person skilled in the art to fully understand the full scope of the disclosure. Modifications to the various exemplary embodiments disclosed herein will be readily apparent to those skilled in the art. Thus, the claims should not be limited to the various aspects of the disclosure described herein, but shall be accorded the full scope consistent with the language of claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:
1. An integrated circuit, comprising:
   input and output pads;
   a first integrated circuit portion having first circuitry, wherein the first integrated circuit portion comprises a processor and a memory; and
   a second integrated circuit portion having second circuitry different from the first circuitry, wherein the second integrated circuit portion comprises a transmitter and a digital-to-analog converter, or a receiver and an analog-to-digital converter;

wherein the first integrated circuit portion is configured to:
provide an input test signal from the input pad to the second integrated circuit portion,
wherein the input test signal comprises a mode signal that signals the second integrated circuit portion to be in a test mode,
wherein each of the first and second integrated circuit portions comprises one or more die-to-die pads, and the first and second integrated circuit portions are electrically connected together through their respective one or more die pads,
wherein the mode signal is provided to the second integrated circuit portion via the one or more die pads, and
wherein the processor and the memory are coupled to the at least one or more die pads, and the transmitter and the digital-to-analog converter or the receiver and the analog-to-digital converter are coupled to the one or more die pads; and
provide an output test signal from the second integrated circuit portion to the output pad, the output test signal being generated by the second integrated circuit portion in response to the input test signal.

2. The integrated circuit of claim 1, wherein the first and second integrated circuit portions are fabricated on different wafers.

3. The integrated circuit of claim 1, wherein the first integrated circuit portion comprises a baseband processor and the second integrated circuit portion comprises a modem configured to modulate a carrier signal with data generated by the baseband processor and to demodulate a carrier signal to recover data transmitted from a remote apparatus.

4. The integrated circuit of claim 1, further comprising one or more general purpose input/output (GPIO) pads comprising the input and output pads.

5. The integrated circuit of claim 1, wherein the first and second integrated circuit portions are configured to enter a test mode, and wherein the first integrated circuit portion provides the input test signal from the input pad to the second integrated circuit portion in response to entering the test mode, and wherein the first integrated circuit portion provides the output test signal from the second integrated circuit portion to the output pad in response to entering the test mode.

6. The integrated circuit of claim 5, wherein the test mode comprises a scan test mode.

7. The integrated circuit of claim 5, wherein the test mode comprises a functional test mode.

8. The integrated circuit of claim 5, wherein the first integrated circuit portion is further configured to cause the second integrated circuit portion to enter the test mode in response to one or more control signals from the input pad.

9. The integrated circuit of claim 6, wherein the first integrated circuit portion is further configured to cause the second integrated circuit portion to enter the test mode by providing one or more control signals to the second integrated circuit portion.

10. The integrated circuit of claim 5, wherein the first integrated circuit portion comprises a multiplexer configured to provide the input test signal from the input pad to the second integrated circuit portion, and a demultiplexer configured to provide the output test signal to the output pad.

11. The integrated circuit of claim 1, wherein the first integrated circuit portion comprises an input pass-through for the input test signal from the input pad to the second integrated circuit portion, and an output pass-through circuit further for the output test signal from the second integrated circuit portion to the output pad.

12. A method of testing an integrated circuit having input and output pads, a first integrated circuit portion having first circuitry, and a second integrated circuit portion having second circuitry different from the first circuitry, the method comprising:
providing an input test signal from the input pad through the first integrated circuit portion to the second integrated circuit portion, wherein the first integrated circuit portion comprises a processor and a memory, and the second integrated circuit portion comprises a transmitter and a digital-to-analog converter, or a receiver and an analog-to-digital converter,
wherein the input test signal comprises a mode signal that signals the second integrated circuit portion to be in a test mode,
wherein each of the first and second integrated circuit portions comprises one or more die-to-die pads, and the first and second integrated circuit portions are electrically connected together through their respective one or more die pads,
wherein the mode signal is provided to the second integrated circuit portion via the one or more die pads, and
wherein the processor and the memory are coupled to the at least one or more die pads, and the transmitter and the digital-to-analog converter or the receiver and the analog-to-digital converter are coupled to the one or more die pads;
generating an output test signal in response to the input test signal at the second integrated circuit portion; and
providing the output test signal from the second integrated circuit portion through the first integrated circuit portion to the output pad.

13. The method of claim 12, wherein the first and second integrated circuit portions are fabricated on different wafers.

14. The method of claim 12, wherein the first integrated circuit portion comprises a baseband processor and the second integrated circuit portion comprises a modem configured to modulate a carrier signal with data generated by the baseband processor and to demodulate a carrier signal to recover data transmitted from a remote apparatus.

15. The method of claim 12, wherein the integrated circuit further comprises one or more general purpose input/output (GPIO) pads comprising the input and output pads.

16. The method of claim 12, further comprising causing the first and second integrated circuit portions to enter a test mode, wherein the input test signal is provided by the first integrated circuit portion from the input pad to the second integrated circuit portion in response to entering the test mode, and wherein the output test signal is provided by the first integrated circuit portion from the second integrated circuit portion to the output pad in response to entering the test mode.

17. The method of claim 16, wherein the entering the test mode comprises performing a scan test.

18. The method of claim 16, wherein the entering the test mode comprises a performing a functional test.

19. The method of claim 16, wherein the first integrated circuit portion causes the second integrated circuit portion to enter the test mode in response to one or more control signals from the input pad.

20. The method of claim 16, wherein the first integrated circuit portion causes the second integrated circuit portion to enter the test mode by providing one or more control signals to the second integrated circuit portion.

21. The method of claim 12, wherein the providing the input test signal from the input pad to the second integrated circuit portion comprises passing input test signal through the first integrated circuit portion, and wherein the providing the output test signal from the second integrated circuit portion to the output pad comprises passing the output test signal through the first integrated circuit portion.

22. The method of claim 12, wherein the providing the input test signal from the input pad to the second integrated circuit portion comprises multiplexing the input test signal to the second integrated circuit portion, and wherein the providing the output test signal from the second integrated circuit portion to the output pad comprises demultiplexing the output test signal to the output pad.

23. An integrated circuit, comprising:
   input and output pads;
   a first integrated circuit portion having first circuitry, wherein the first integrated circuit portion comprises a processor and a memory; and
   a second integrated circuit portion having second circuitry different from the first circuitry, wherein the second integrated circuit portion comprises a transmitter and a digital-to-analog converter, or a receiver and an analog-to-digital converter;
   wherein the first integrated circuit portion comprises:
      means for providing an input test signal from the input pad to the second integrated circuit portion,
         wherein the input test signal comprises a mode signal that signals the second integrated circuit portion to be in a test mode,
         wherein each of the first and second integrated circuit portions comprises one or more die-to-die pads, and the first and second integrated circuit portions are electrically connected together through their respective one or more die pads, and
         wherein the mode signal is provided to the second integrated circuit portion via the one or more die pads, and
      wherein the processor and the memory are coupled to the at least one or more die pads, and the transmitter and the digital-to-analog converter or the receiver and the analog-to-digital converter are coupled to the one or more die pads; and
   means for providing an output test signal from the second integrated circuit portion to the output pad, the output test signal being generated by the second integrated circuit portion in response to the input test signal.

24. The integrated circuit of claim 23, wherein the first and second integrated circuit portions are fabricated on different wafers.

25. The integrated circuit of claim 23, wherein the first integrated circuit portion comprises a baseband processor and the second integrated circuit portion comprises a modem configured to modulate a carrier signal with data generated by the baseband processor and to demodulate a carrier signal to recover data transmitted from a remote apparatus.

26. The integrated circuit of claim 23, further comprising one or more general purpose input/output (GPIO) pads comprising the input and output pads.

27. The integrated circuit of claim 23, wherein the first and second integrated circuit portions are configured to enter a test mode, and wherein the means for providing an input test signal is configured to provide the input test signal from the input pad to the second integrated circuit portion in response to entering the test mode, and wherein the means for providing the output test signal is configured to provide the output test signal from the second integrated circuit portion to the output pad in response to entering the test mode.

* * * * *